(12) United States Patent
Ju et al.

(10) Patent No.: US 6,584,136 B2
(45) Date of Patent: Jun. 24, 2003

(54) FOLDED CAVITY LASER

(75) Inventors: Young-Gu Ju, Taejon (KR); Byueng-Su Yoo, Taejon (KR); O-Kyun Kwon, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 19 days.

(21) Appl. No.: 09/882,342

(22) Filed: Jun. 15, 2001

(65) Prior Publication Data
US 2002/0085612 A1 Jul. 4, 2002

(30) Foreign Application Priority Data
Dec. 30, 2000 (KR) ......................................... 2000-86751

(51) Int. Cl.⁷ ................................................. H01S 3/08
(52) U.S. Cl. ....................................... 372/102; 372/108
(58) Field of Search ................................. 372/102, 108

(56) References Cited
U.S. PATENT DOCUMENTS

| | | | |
|---|---|---|---|
| 3,993,528 A | | 11/1976 | Pauly |
| 4,894,840 A | | 1/1990 | Liau et al. |
| 4,990,465 A | * | 2/1991 | Liau et al. ................... 437/129 |
| 5,195,150 A | * | 3/1993 | Stegmueller et al. ......... 385/33 |
| 6,339,496 B1 | * | 1/2002 | Koley et al. ................. 359/344 |

OTHER PUBLICATIONS

D.A. Livshits, A. Yu. Egorov, and H. Riechert 8W Continuous Wave Operation Of InGaAsN Lasers At 1.3 micrometers Electronics Letters; Aug. 3, 2000; vol. 36, No. 16.*

8W continuous wave operation of InGaAsN lasers at 1.3 um by D.A. Livshits et al.

* cited by examiner

Primary Examiner—Paul Ip
Assistant Examiner—Leith A Al Nazer

(57) ABSTRACT

A folded cavity laser for generating a laser beam, includes a substrate provided with a distributed Bragg reflector (DBR); an active medium formed above the DBR for amplifying the laser beam; a first and a second mirrors formed on sides of the active medium, respectively, for making a horizontal cavity and for reflecting the amplified laser beam to the DBR; and a microlens, formed on the substrate opposite the DBR, for making the amplified laser beam astigmatic after passing therethrough.

7 Claims, 5 Drawing Sheets

FOLDED CAVITY LASER

FIELD OF THE INVENTION

The present invention relates to a folded cavity laser; and, more particularly, to a folded cavity surface emitting laser by employing an astigmatic microlens which can correct the asymmetric beam shape due to the asymmetric of active medium.

DESCRIPTION OF THE PRIOR ART

With popularization of Internet, a speedy optical communication network is actively under-construction and with increasing demands, the optical communication network spreads from a backbone network to an individual user. Now, cost competitiveness of a photo device is being a big barrier in populating the optical communication.

A conventional edge-emitting laser can be easily manufactured, however, since a cavity of the conventional edge emitting laser is formed by cleaving its function must be measured after a packaging. Moreover, the conventional edge emitting laser has an astigmatism, meaning, a shape of an emitting beam has distorted by an asymmetry of a laser active medium, along to a horizontal and a vertical direction in an epitaxial layer. The distorted beam shape makes a mode coupling efficiency deteriorate and increases a packaging cost.

A surface-emitting laser is a kind of laser devices, which complements the above problems, and has two types, i.e., a folded cavity type and a vertical cavity type.

The folded cavity type makes 45° reflecting mirrors by using an ion etching and a chemical wet etching, instead of a cleaved facet, wherein the 45° reflecting mirrors emit a light beam to the epitaxial layer, vertically, thereby measuring an element characteristics in a state of wafer. However, the asymmetrical radiation angle problem is not solved still.

In the vertical cavity type, a distributed Bragg reflector (hereinafter, referred to as a DBR) is grown top and bottom of the active medium, through epitaxial growth, so that an oscillation direction is being vertical on the epitaxial surface. Therefore, the vertical cavity type controls its beam shape to have a circular symmetry.

Recently, an 850 nm vertical cavity surface emitting laser device has been developed.

Actually, the progress of vertical-cavity surface-emitting laser development in 1.3 $\mu$m to 1.5 $\mu$m, which can be used over 300~500 m, is slow. It is because, materials which are used in a long-wavelength laser have inferior thermal characteristics and the vertical cavity surface emitting laser requires a strict optical gain condition.

Especially, in a 1.3 $\mu$m wave length, InGaAsN and InGaAsP materials are realized as an edge emitting laser device in GaAs and InP substrates, however, the vertical cavity surface emitting laser device using this material has not been reported yet and it shows manufacturing difficulties of the above-mentioned device.

SUMMARY OF THE INVENTION

It is, therefore, an object of the present invention to provide a folded cavity laser which complements a radiation difference that is caused by an asymmetry of a laser mode, by integrating an astigmatic microlens with the laser device.

Another object of the present invention is to present a folded cavity laser appropriate for mass production through a semiconductor manufacturing process without extra beam alignments, and provide a folded cavity laser which has improved characteristics comparable to those of the vertical-cavity surface-emitting laser.

In accordance with an aspect of the present invention, there is provided a folded cavity laser for generating a laser beam, comprising: a substrate provided with a distributed Bragg reflector (DBR); an active medium formed above the DBR for amplifying the laser beam; a first and a second mirrors formed on sides of the active medium, respectively, for making a horizontal cavity and for reflecting the amplified laser beam to the DBR; and a microlens, formed on the substrate opposite the DBR, for making the amplified laser beam astigmatic after passing therethrough.

In accordance with another aspect of the present invention, there is provided a folded cavity laser incorporating therein a microlens which is in the form of cylinder.

In accordance with another aspect of the present invention, there is provided a folded cavity laser incorporating therein a microlens which is a polymer pattern, formed by a photolithography process.

In accordance with another aspect of the present invention, there is provided a folded cavity laser incorporating therein mirrors which are inclined approximately 45° with respect to an optical axis of a horizontal cavity.

In accordance with another aspect of the present invention, there is provided a folded cavity laser incorporating therein a laser active medium which is InGaAsN material and a substrate which is GaAs material.

In accordance with another aspect of the present invention, there is provided a folded cavity laser incorporating therein an active medium which is any one selected from a group consisting of InGaAsP, AlInGaAs or InAs quantum dot, and a substrate which is InP material.

In accordance with another aspect of the present invention, there is provided a folded cavity laser incorporating therein a microlens which is a GaAs pattern formed by patterning and etching a substrate.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, a folded cavity laser according to the present invention will be described in detail referring to the accompanying drawings.

Figure 1:
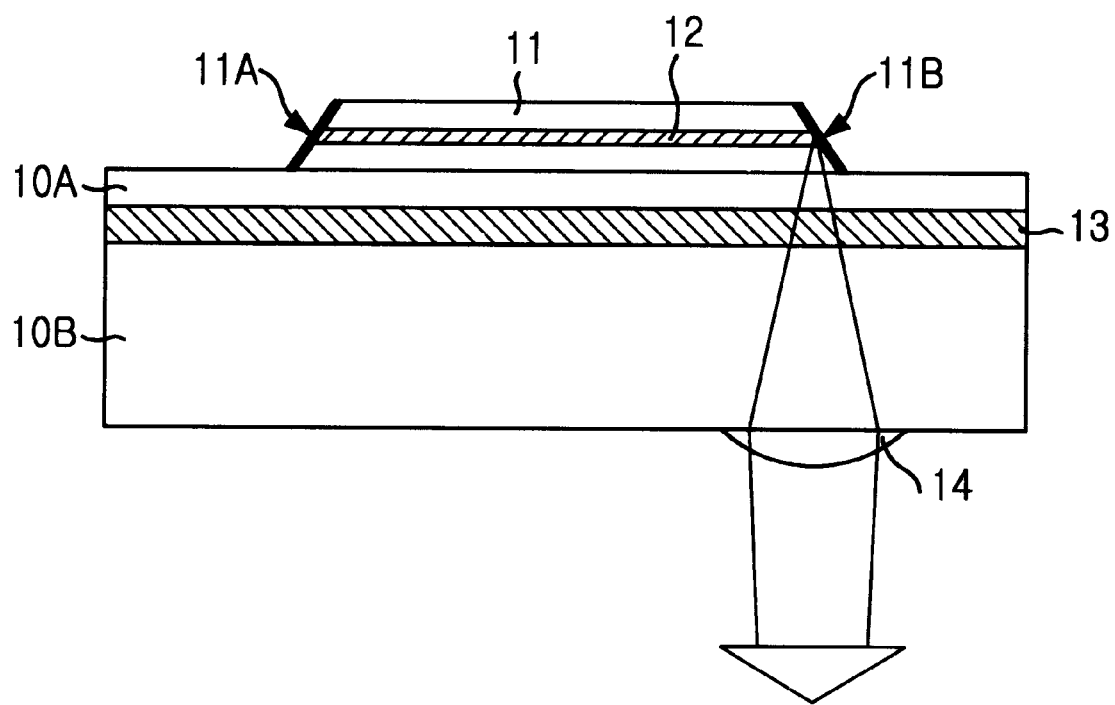
FIG. 1 is a cross-sectional view illustrating a light beam path in a laser device where an astigmatic microlens and an active medium are formed in accordance with the present invention.

Referring to FIG. 1, a DBR layer 13 and an active medium 12, made of InGaAsN which is formed by an epitaxial growing method are formed on a substrate 10B. Preferably, the substrate 10B is made of a material such as GaAs. An stigmatic microlens 14, e.g., made of a polymer, is formed on a backside of the substrate 10B. Meanwhile, a pair of reflecting mirrors are formed on sides of the active medium 12 in such a way that they are inclined at an angle, e.g., approximately 45°, with respect to an axis of the active medium 12.

As shown in FIG. 1, a light beam in the laser device is amplified due to an optical gain obtained by traveling the active medium 12 back and forth. Although a material such as InGaAsN can be grown on a GaAs substrate, it is difficult to form a vertical surface emitting laser because it has a 1.3 $\mu$m central frequency and a low optical gain. However, the material can meet a laser oscillation condition by extending the length of cavity to hundreds of $\mu$m as an edge emitting laser. By using the above-mentioned structure, InGaAsN can be grown on the GaAs substrate and meet a laser oscillation condition.

The reflecting mirror 11 is formed on the active medium 12 by using an ion etching and a chemical wet etching in such a way that its side surfaces 11A, 11B are inclined at an angle, e.g., approximately 45°, with respect to the axis of the active medium 12, whereby the light beam changes its path approximately 90° at the side surfaces 11A, 11B. The deflected light beam impinges onto a DBR layer 13, which is formed under the active medium 12, then a portion of the light beam is transmitted thereto in a direction normal to an interface between the DBR layer 13 and the substrate 10B and the remaining portion of the light beam is reflected back to the side surfaces 11A, 11B.

It is possible that the left side surface 11A can be formed in such a way that it is inclined at an angle, e.g., 90°, with respect to the axis of the active medium 12.

In this case, the left side surface 11A plays role as a cleaved facet. And also, in place of the DBR layer 13, an air layer formed by an undercut etching can be used as a reflecting layer. As described above, a folded cavity is formed, whereby the light beam is emitted to a direction vertical to the substrate 10B. At this time, since the DBR layer 13 has an asymmetric geometry, the light beam has a beam spot asymmetric after passing through the DBR layer 13. To compensate for the above problem, an oval-shaped microlens 21 in FIG. 2A or a cylindrical microlens 22 in FIG. 2B are formed on a backside of the substrate 10B.

As described above, by integrating the astigmatic microlens into the substrate 10, the asymmetric beam shape becomes a circular beam shape after passing through the astigmatic microlens, thereby increasing an optical fiber coupling efficiency. In accordance with the preferred embodiment, the astigmatic microlens can modulate a focal length of the light beam and may introduce directly the light beam into the optical fiber, so it reduces a packaging cost by replacing optical components, e.g., lenses for coupling the light beam into the optical fiber, arranged between the optical fiber and the folded cavity laser with the astigmatic microlens.

Figure 3A:
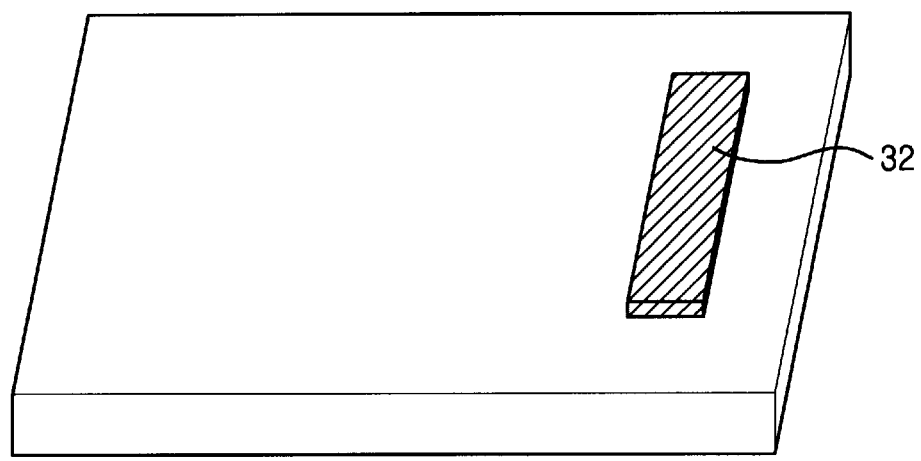
FIGS. 3A to 3C are diagrams showing an astigmatic microlens forming process in accordance with a second preferred embodiment of the present invention.
Figure 3B:
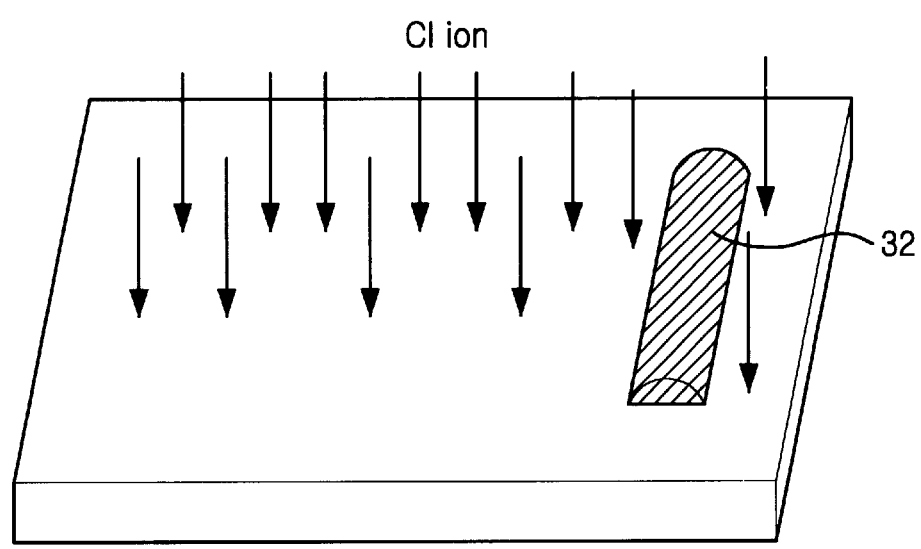

Referring to FIG. 3A, a method of manufacturing the astigmatic microlens is described hereinafter in accordance with a preferred embodiment. First, a rectangular shaped polymethylgluterimide (hereinafter, referred to as a PMGI) pattern 32 is formed on a backside of the substrate by using a UV lithography. Particularly, the PMGI pattern 32 method can be implemented by following the manual of Microchem Corporation. After patterning the PMGI pattern 32, a heat treatment is carried out at an oven at a temperature of approximately 290° C. during about 30 minutes for reflowing the PMGI pattern 32. After the reflow, the rectangular shaped PMGI pattern 32 is changed to a curved surface pattern by a surface tension, as shown in FIG. 3B.

At this time, a portion of the PMGI pattern 32 contacting with the substrate 10B is not changed usually, however, a pedestal is formed by slightly etching the substrate 10 in the substrate 10B to prevent the reflowed polymer from spreading to cope with a deformation problem of PMGI pattern 32.

Figure 3C:
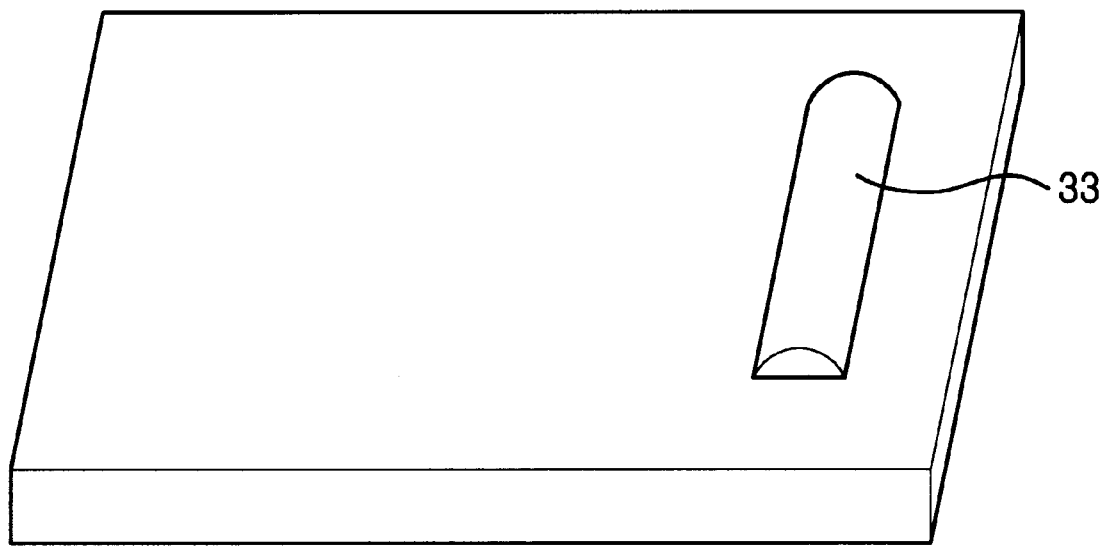

The curved surface made by the above method has a cylindrical shape which has a large and a small curvatures to a longitudinal direction and a lateral direction, respectively. A polymer resist itself may be used as an astigmatic microlens, but the polymer resist may be transferred to the substrate 10 to increase mechanical intensity. That is, the polymer, such as PMGI, can be etched by an ion etching process, such as Cl, and the GaAs which is used in the substrate 10, also can be etched by the Cl ion too, so the cylindrical shape can be transferred to the substrate 10. The cylindrical shape of lens, which is transferred to the substrate 10 after carrying out an ion etching, is described in FIG. 3C.

Figure 2A:
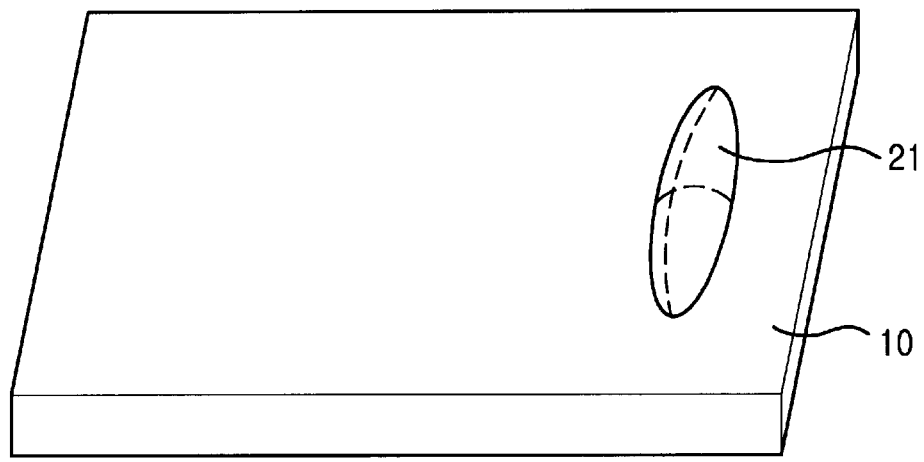
FIGS. 2A and 2B are perspective views showing an astigmatic microlens forming structure in accordance with a first preferred embodiment of the present invention.
Figure 2B:
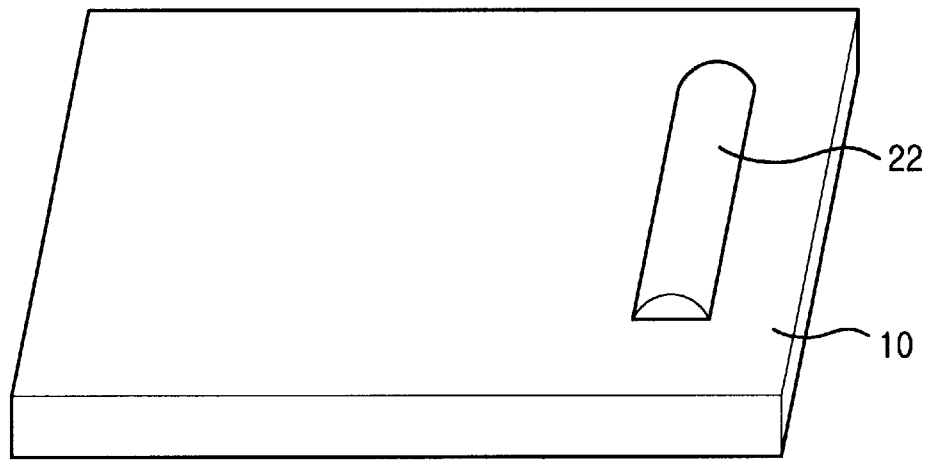

Likewise, before the reflow process, if the polymer pattern is not a rectangle shape but an oval shape, then the oval shaped astigmatic microlens 21 is formed after the reflow process, as shown in FIG. 2A.

Also, the etch rate of the substrate 10 and the polymer can be controlled based on an asymmetrical shape of the polymer pattern and a condition of the ion etching so that differences of a focal length of the astigmatic microlens 21 are modulated. The cylindrical lens 22 is classified into any one of astigmatic lenses, which has an infinite focal length in sagital plane and a finite focal length in tangential (meridional) plane. The sagital plane corresponds to the junction plane before being deflected by 45° mirror. Thus, the beam has larger divergence angle in tangential plane than in sagital plane. Hereafter, we refer to the bundle of rays lying on the tangential plane as a tangential ray, and to the bundle of rays lying on the sagital plane as a sagital ray.

Two examples will be presented for helping to understand the concrete implementation of this device. The first one deals with focusing laser emission into a fiber without external optics. The second one deals with the combination of the invention and an additional microlens to correct the beam shape.

For the first example, if a tangential ray, vertical to a junction plane of the laser device, has an optical mode of 0.8 $\mu$m and a radiation angle of 30°, and a sagital ray, parallel to the junction plane of the laser device, has an optical mode of 1.6 $\mu$m and a radiation angle of 15°.

If a thickness of the substrate 10 is 100 $\mu$m and the light beam is diverged in the substrate 10 with a half angle approximately 30°, a diameter of the light beam becomes approximately 110 $\mu$m at the astigmatic microlens 21. When a diameter of the astigmatic microlens 21 is approximately 100 $\mu$m, the astigmatic microlens 21 can converge most of the light beam. Also, if a curvature of the astigmatic microlens 21 is approximately 52 $\mu$m, an image is focused on an image plane which is at a distance of 100 $\mu$m from the astigmatic microlens 21. The height of the astigmatic microlens 21 corresponding to the curvature is approximately 50 $\mu$m, and this can be realized by using microlens manufacturing method.

A size of a geometrical image, formed on the tangential plane is approximately 2.4 $\mu$m to an axis vertical thereto and approximately 4.8 $\mu$m to an axis parallel thereto. If a difference between two focal lengths of the astigmatic microlens 21 is approximately 2.0 μm at the junction plane, a symmetrical mode of 4.8 μm can be formed by designing the astigmatic microlens 21 to have a difference between focal lengths approximately 2.0 μm.

After passing through the astigmatic microlens 21, the light beam become increased in its diameter by approximately 3.0 μm due to diffraction. Therefore, the beam has a shape of a symmetrical mode within a range of 9.0 μm, which is an optical fiber diameter of a single mode, thereby increasing an optical coupling efficiency with the optical fiber.

For the second example, we suggest a case of a cylindrical lens integrated on the back side of substrate, a curvature and a height thereof are 67 μm and 22 μm, respectively, a light beam may be collimated in tangential plane. In this case, the sagital ray has 50 μm of diameter and 15° of divergence angle when the light beam reaches the cylindrical lens. If the radiation angle increases about three times, e.g., 45°, due to a refractive index difference between the substrate 10 and an air, on the surface, the width of the sagital ray is became same as that of tangential ray after traveling 25 μm away from microlens normal to the substrate.

Figure 4A:
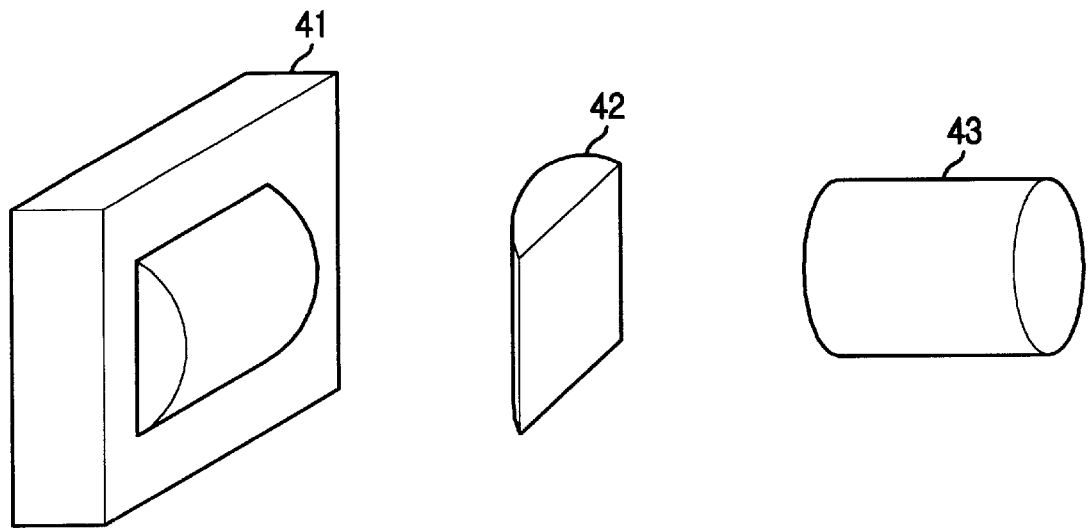
FIGS. 4A and 4B are diagrams showing a light beam passing through a substrate in accordance with the present invention.
Figure 4B:
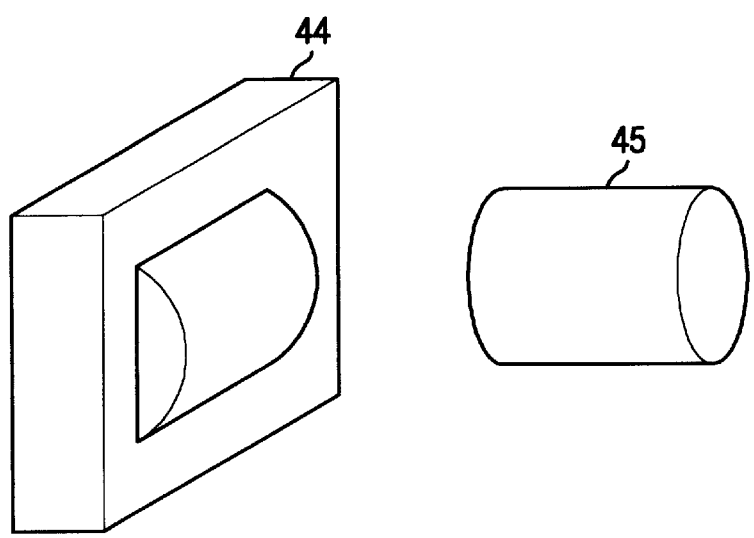

In the above-mentioned location, by placing the cylindrical microlens 42 with its cylindrical axis perpendicular to that of microlens 41, the sagital ray is collimated too. As a result, a symmetrical type of light beam is formed and the symmetrical type of light beam is focused by GRIN lens 43 into the optical fiber. Referring to FIG. 4B, a cylindrical microlens is fabricated on one side of the GRIN (graded refractive index) lens 45, to simplify an optical system and an arrangement.

In the second optical system, by using the oval microlens instead of the cylindrical microlens 42, the light beam on the axis with small radiation angle decreases the radiation angle to provide mobility in the position of the lens, and increases allowed tolerance in the axis direction. Eventually, those lenses can be replaced with one microlens. Finally, the laser integrated with the cylindrical microlens may compensate for an astigmatism, which is generated from the laser, with usage of another astigmatic microlens, thereby increasing a coupling efficiency to the optical fiber and decreasing the number of optical components used in packaging.

The present invention compensates for the difference of a radiation angle, which is caused by an asymmetry of the laser mode, by monolithically integrating an astigmatic microlens. The above-mentioned devices can be manufactured by semiconductor manufacturing process, and without separate optical alignments to each of the devices, thereby providing a laser device that the characteristics of the conventional folded cavity surface emitting laser improves as much as that of the vertical cavity surface emitting laser. Additionally, the symmetrical mode increases a coupling efficiency of a light beam of the optical fiber and reduces packaging cost by decreasing optical devices used in packaging and by increasing alignment tolerance. Also, the device can be characterized characteristic in wafer condition, which is an advantage of the surface emitting laser, and thereby increasing production yield.

Especially, in case of the InGaAsN material, which can manufacture an edge-emitting laser but has difficulties in making the vertical cavity surface emitting laser due to low optical gain, by using the symmetrical modes, the InGaAsN material can use the edge-emitting laser manufacturing process by maintaining an advantage of the mode characteristic of the vertical cavity surface emitting laser.

Moreover, the InGaAsN material takes advantage of GaAs substrate, such as processing on a large size wafer and good thermal conductivity of AlGaAs material.

While the present invention has been described with respect to the particular embodiments, it will be apparent to those skilled in the art that various changes and modifications may be made without departing from the scope of the invention as defined in the following claims.

What is claimed is:

1. A folded cavity laser for generating a laser beam, comprising:
   a substrate provided with a distributed Bragg reflector (DBR);
   an active medium formed above the DBR for amplifying the laser beam;
   a first and a second mirrors formed on sides of the active medium, respectively, for making a horizontal cavity and for reflecting the amplified laser beam to the DBR; and
   a microlens, formed on the substrate opposite the DBR, for making the amplified laser beam astigmatic after passing therethrough.

2. The folded cavity laser of claim 1, wherein microlens is in the form of cylinder.

3. The folded cavity laser of claim 1, wherein the microlens is a polymer pattern, which is formed by a photolithography process.

4. The folded cavity laser of claim 1, wherein the mirrors are declined approximately 45° with respect to an optical axis of the horizontal cavity.

5. The folded cavity laser of claim 1, wherein the active medium is InGaAsN material and the substrate is GaAs material.

6. The folded cavity laser of claim 1, wherein the substrate is InP material and the active medium is made of a material selected from a group consisting of InGaAsP, AlInGaAs or InAs quantum dot.

7. The folded cavity laser of claim 1, wherein the microlens is a GaAs pattern, which is formed by patterning and etching the substrate.

* * * * *